(12) United States Patent
Jevtic et al.

(10) Patent No.: US 7,109,788 B2
(45) Date of Patent: Sep. 19, 2006

(54) APPARATUS AND METHOD OF IMPROVING IMPEDANCE MATCHING BETWEEN AN RF SIGNAL AND A MULTI- SEGMENTED ELECTRODE

(75) Inventors: Jovan Jevtic, West Allis, WI (US); Andrej Mitrovic, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 368 days.

(21) Appl. No.: 10/469,593

(22) PCT Filed: Feb. 27, 2002

(86) PCT No.: PCT/US02/05588

§ 371 (c)(1), (2), (4) Date: Feb. 26, 2004

(87) PCT Pub. No.: WO02/071631

PCT Pub. Date: Sep. 12, 2002

(65) Prior Publication Data

US 2004/0134614 A1 Jul. 15, 2004

Related U.S. Application Data

(60) Provisional application No. 60/272,454, filed on Mar. 2, 2001.

(51) Int. Cl.
*H03D 3/02* (2006.01)

(52) U.S. Cl. ....................................................... 329/346

(58) Field of Classification Search ................ 329/346, 329/323; 327/72
See application file for complete search history.

(56) References Cited

U.S. PATENT DOCUMENTS

| | | | |
|---|---|---|---|
| 6,310,667 B1 * | 10/2001 | Nakayoshi et al. ........... 349/42 |
| 6,351,683 B1 | 2/2002 | Johnson et al. | |
| 6,366,622 B1 | 4/2002 | Brown et al. | |
| 6,535,785 B1 | 3/2003 | Johnson et al. | |
| 6,621,537 B1 * | 9/2003 | Nakamura et al. ............ 349/43 |
| RE38,292 E * | 10/2003 | Satou .......................... 438/158 |
| 6,710,372 B1 * | 3/2004 | Kim ............................. 257/72 |

* cited by examiner

*Primary Examiner*—John F. Niebling
*Assistant Examiner*—Andre' Stevenson
(74) *Attorney, Agent, or Firm*—Oblon, Spivak, McClelland, Maier & Neustadt, P.C.

(57) ABSTRACT

An apparatus and method of improving impedance matching between a RF signal and a multi-segmented electrode in a plasma reactor powered by the RF signal. The apparatus and method phase shifts the RF signal driving one or more electrode segment of the multi-segmented electrode, amplifies the RF signal, and matches an impedance of the RF signal with an impedance of the electrode segment, where the RF signal is modulated prior to matching of the impedance of the RF signal. The apparatus and method directionally couples an output of the matching of the impedance of the RF signal and the electrode segment, and adjusts the output of the matching of the impedance of the RF signal such that a directionally coupled output signal and a reference signal representing the RF signal at the output of the master RF oscillator produces a demodulated signal of minimal amplitude.

15 Claims, 7 Drawing Sheets

APPARATUS AND METHOD OF IMPROVING IMPEDANCE MATCHING BETWEEN AN RF SIGNAL AND A MULTI- SEGMENTED ELECTRODE

CROSS-REFERENCE TO RELATED APPLICATIONS

This application is a national stage application of PCT International Application No. PCT/US02/05588, filed Feb. 27, 2002, which claims priority to U.S. Provisional Application No. 60/272,454, filed Mar. 2, 2001. The entire contents of these prior applications are incorporated herein by reference.

BACKGROUND OF THE INVENTION

1. Field of the Invention

The present invention relates generally to an apparatus and method of improving impedance matching between an RF signal and a multi-segmented electrode in a plasma reactor powered by the RF signal.

2. Discussion of the Background

Manufacturers of semiconductor integrated circuits (IC) are faced with severe competitive pressure to improve their products. This pressure in turn is driving the manufacturers of the equipment used by IC manufacturers to improve the performance of their equipment. One particular type of tool that is widely used, and that is therefore particularly susceptible to these competitive pressures, is the plasma reactor. These reactors can be used to remove material, or, with modifications, the reactors can be used to deposit material. The mechanisms for either deposition or removal are complex, but in either case, it is essential to control the physical processes at the surface of the wafer. Control of these processes is the focus of significant technological development.

One of the key factors that determine the yield and overall quality of an IC is the uniformity of processes, such as etching, at the surface of the wafer. In plasma reactors, uniformity is governed by the design of the overall system, and in particular by the design of the RF feed electronics and the associated control circuitry.

SUMMARY OF THE INVENTION

The inventors have recognized that one important method of providing a uniform process involves measuring inter-electrode coupling in plasma reactors with multi-segmented electrodes, and adjusting the process accordingly. The inventors have identified various difficulties in measuring the inter-electrode coupling in plasma reactors, as will be described in detail below, and the inventors have provided an apparatus. Thus, a method is intended to address these difficulties and improve impedance matching between an RF signal and a multi-segmented electrode in a plasma reactor powered by the RF signal.

An embodiment of the present invention advantageously provides an apparatus that includes an electrode segment adapted to be connected to the RF signal by a circuit. The circuit includes a phase shifter adapted to be connected to the RF signal, an amplifier connected to an output of the phase shifter, and a matching network connected to an output of the amplifier, where the matching network is configured to match an impedance of the RF signal with an impedance of the electrode segment. The circuit further includes a modulation source configured to modulate the RF signal prior to receipt by the matching network, a directional coupler connected to an output of the matching network and having an output connected to the electrode segment, and a demodulator configured to receive an output signal from the directional coupler and a reference signal representing the RF signal at the output of the master RF oscillator. The circuit also includes a control system connected to an output of the demodulator, where the control system is configured to control the output of the matching network such that the output signal of the demodulator is minimized.

The apparatus preferably provides that the modulation source is connected to an input terminal of the phase shifter, or, alternatively, the modulation source is connected to an input terminal of the amplifier. The apparatus preferably provides that the modulation source is adjustable. In alternative embodiments, the reference signal is received by the demodulator from the output of the master RF oscillator. In alternative embodiments, the demodulator is synchronous, or the demodulator is asynchronous (non-synchronous). The apparatus preferably provides that the control system is configured to control the phase shifter and the amplifier. The apparatus preferably includes a filter connected to an output of the directional coupler, where the filter has an output connected to the electrode segment.

The apparatus preferably further includes an additional electrode segment adapted to be connected to the RF signal by the circuit. The circuit further includes an additional phase shifter adapted to be connected to the RF signal, an additional amplifier connected to an output of the additional phase shifter, an additional matching network connected to an output of the additional amplifier. The additional matching network is configured to match an impedance of the RF signal with an impedance of the additional electrode segment, and the modulation source is selectively configured to modulate the RF signal prior to receipt by the additional matching network. The circuit further includes an additional directional coupler connected to an output of the additional matching network, where the additional directional coupler has an output connected to the additional electrode segment. The demodulator is configured to selectively receive (1) an output signal from the additional directional coupler and (2) an additional reference signal representing the RF signal at the output of the master RF oscillator. The control system is configured to control the output of the additional matching network such that the output signal of the additional demodulator is minimized.

An alternative embodiment of the apparatus preferably includes an additional electrode segment adapted to be connected to the RF signal by the circuit. The circuit includes an additional phase shifter adapted to be connected to the RF signal, an additional amplifier connected to an output of the additional phase shifter, an additional matching network connected to an output of the additional amplifier, where the additional matching network is configured to match an impedance of the RF signal with an impedance of the additional electrode segment, an additional modulation source configured to modulate the RF signal prior to receipt by the additional matching network, and an additional directional coupler connected to an output of the additional matching network, where the additional directional coupler has an output connected to the additional electrode segment. In this embodiment the demodulator is configured to receive an output signal from the additional directional coupler and an additional reference signal representing the RF signal at the output of the master RF oscillator, and the control system is connected to the output of the demodulator, where the control system is configured to control the output of the additional matching network such that the output signal of the additional demodulator is minimized.

The apparatus of the present invention is preferably incorporated into a plasma reactor including a process chamber; a multi-segmented electrode within the process chamber, and an RF power supply system configured to generate an RF signal to drive an electrode segment of the multi-segmented electrode, where the circuit connects the electrode segment to the RF signal.

The present invention further advantageously provides a method including the steps of phase shifting the RF signal driving an electrode segment of the multi-segmented electrode, amplifying the RF signal, and matching an impedance of the RF signal with an impedance of the electrode segment, where the RF signal is modulated prior to matching of the impedance of the RF signal. The method further includes the steps of directionally coupling an output of the matching of the impedance of the RF signal and the electrode segment, and adjusting the output of the matching of the impedance of the RF signal such that a directionally coupled output signal and a reference signal representing the RF signal at the output of the master RF oscillator produces a minimized output signal from the demodulator.

The method preferably provides that the step of adjusting the output of the matching of the impedance of the RF signal includes the steps of demodulating the directionally coupled output signal and the reference signal, and controlling the output of the matching of the impedance of the RF signal such that the demodulated directionally coupled output signal is minimized. In alternative embodiments, the RF signal is phase modulated prior to matching of the impedance of the RF signal, or the RF signal is amplitude modulated prior to matching of the impedance of the RF signal. Further, in alternative embodiments, the reference signal represents a RF signal output from the master RF oscillator. The method preferably includes the step of filtering the RF signal after the RF signal is directionally coupled and before the RF signal is received by the electrode segment.

The method preferably includes the steps of phase shifting an additional RF signal driving an additional electrode segment of the multi-segmented electrode, amplifying the additional RF signal, matching an impedance of the additional RF signal with an impedance of the additional electrode segment, where the additional RF signal is modulated prior to matching of the impedance of the additional RF signal, directionally coupling an output of the matching of the impedance of the additional RF signal and the additional electrode segment, and adjusting the output of the matching of the impedance of the additional RF signal such that an additional directionally coupled output signal and an additional reference signal representing an additional RF signal at the output of the master RF oscillator prior to modulation produce a minimized signal at the output of an additional demodulator. In alternative embodiments, the RF signal and the additional RF signal are selectively modulated using a single modulation source, or the RF signal and the additional RF signal are modulated using independent modulation sources.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

The inventors have identified problems with conventional processing reactors and methods of using those reactors that are solved by the present invention. Therefore, the present invention provides an apparatus and a method for improved impedance matching between an RF signal and a multi-segmented electrode in a plasma reactor powered by the RF signal which overcomes the shortcomings identified with regard to the conventional processing reactors.

The inventors recognized the difficulty in measuring the inter-electrode coupling in plasma reactors with multi-segmented electrodes. There is considerable coupling between the electrodes of plasma reactors with multi-segmented electrodes. The coupling is due to mutual capacitance between the electrodes, mutual lead inductances, imperfect isolation between the RF generators that drive each electrode, and coupling between the matching networks. However, when the reactor is energized and plasma is present, the coupling between the electrodes increases dramatically due to the presence of the plasma. Thus, measurements of the coupling between electrodes that are made when the reactor is not operating are not valid when the reactor is being used and there is plasma present. What is needed is a way to measure the coupling between electrodes in plasma reactors with multi-segmented electrodes in order to facilitate the achievement of improved impedance matching for each electrode.

The difficulty is measuring the inter-electrode coupling in plasma reactors with multi-segmented electrodes while the process evolves. As the process conditions in the reactor change during use, the coupling between the electrodes also changes. What is needed is a way to measure, as a process proceeds, the changes in the coupling between the electrodes that routinely occur during normal reactor use as a consequence of electrode erosion, process changes, etc. Similarly, for the application of RF power to an electrode with a consistent impedance match, the ability to differentiate the contributions to a measured RF signal at the electrode from inter-electrode coupling and plasma reflections of the signal applied to the electrode provides a considerable advantage for repeatable process conditions.

Additionally, it is important to measure the inter-electrode coupling in plasma reactors with multi-segmented electrodes without interfering with the process. Plasma based process dynamics are sensitive to parasitic or stray capacitances and inductances whose impedances depend on process parameters. Thus, a change in the plasma due to a measurement affects the process, which can adversely affect the performance of the reactor. What is needed is a way to measure the inter-electrode coupling in plasma reactors with multi-segmented electrodes without interfering with the process. The method is based on modulating, in a way that is benign to the process, the RF signal being used to power the electrodes, and afterwards demodulating the ensuing signal.

Figure 1:
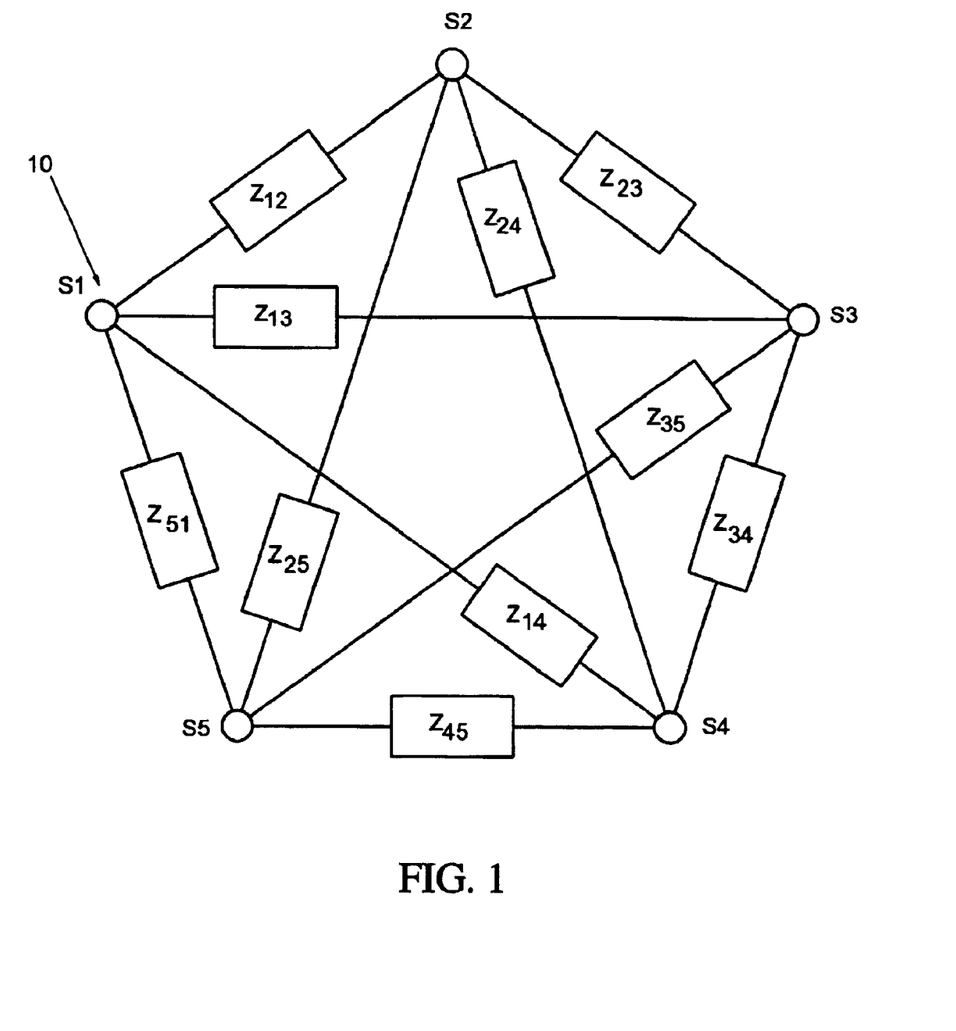
FIG. 1 is an electrical equivalent circuit representing electrical connections to electrode segments and inter-electrode coupling impedances for a five-electrode reactor.

FIG. 1 depicts an electrical equivalent circuit that represents the electrical or electrode connections 10 to the electrode segments, $S_1, S_2, \ldots S_5$ for a five-electrode system, and the twenty (although only ten are shown) interelectrode coupling impedances $Z_{12}, Z_{13}, Z_{14}, Z_{15}, Z_{23}, Z_{24}, Z_{25}, Z_{34}, Z_{35},$ and $Z_{45}$ ($Z_{21}, Z_{31}, Z_{41}, Z_{51}, Z_{32}, Z_{42}, Z_{52}, Z_{43}, Z_{53},$ and $Z_{54}$ are not depicted). In general there may be fewer than or greater than five electrodes. For an N electrode system, the impedances $Z_{ij}$, where $i,j=1, 2 \ldots N$, subject to the condition that i is not equal to j, represent the inter-electrode coupling impedances. For the case considered above, N=5. For a linear circuit $Z_{ij}=Z_{ji}$, and, in general, the total number of inter-electrode coupling impedances is $N(N-1)/2$. Thus, for an electrode with more than 3 segments, the number of unknown coupling parameters is larger than the number of accessible terminals, and the segments, in general, have to be excited in $N(N-1)/2$ different ways to determine all of the interactions, unless the symmetry of the segmented electrode would allow one to infer that certain inter-electrode impedances are equal. For a non-linear circuit, the total number of inter-electrode coupling impedances is $N(N-1)$. What is needed is a way to measure the inter-electrode coupling in plasma reactors with multi-segmented electrodes or a plurality of electrodes.

It is even more difficult to measure the inter-electrode coupling in plasma reactors with multi-segmented electrodes when there are non-linear elements present in the network. The presence of the non-linear plasma introduces significant added complexity to the problem of determining the inter-electrode coupling in plasma reactors with multi-segmented electrodes. This complexity is significantly less than it once was because of tremendous advances that have been made in understanding the dynamics of non-linear systems. However, even now only simplified cases usually lend themselves to analysis. Such cases often lack the generality of plasma systems as a whole, and actual commercially available plasma reactors in particular. What is needed is a way to measure the inter-electrode coupling in actual plasma reactors with multi-segmented electrodes when non-linear elements are present in the RF network.

Figure 2:
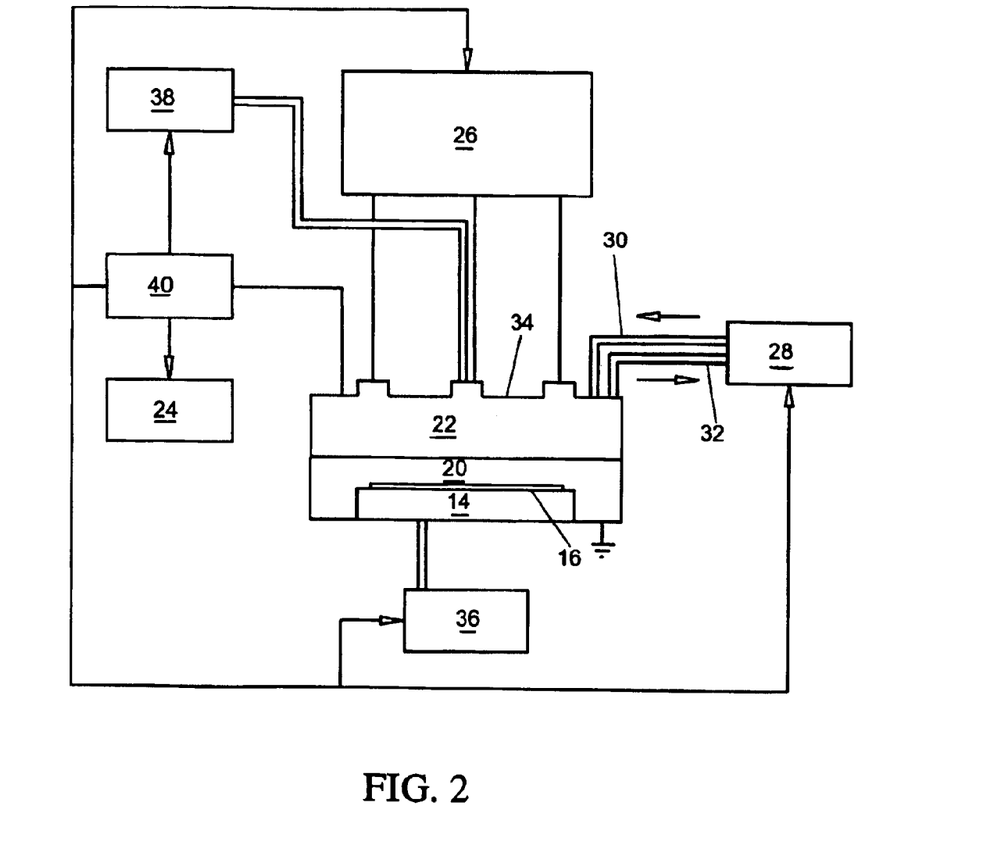
FIG. 2 is a schematic representation of a plasma reactor system according to the present invention.

The preferred embodiment of a plasma reactor system for processing a substrate or wafer according to the present invention is depicted in FIG. 2. The system generally includes a plasma chamber 20 that contains two or more capacitively-coupled, electrode segments 22 and a wafer chuck 14 for supporting a wafer 16, and a wafer handling and robotics system 24 that moves wafers into and out of the plasma chamber 20. The system further includes a multiple segment inject electrode RF power supply system 26 that includes separate RF generation systems to drive each segment 22 of the segmented upper electrode and an inter-electrode coupling impedance measuring capability, and a cooling system 28 that circulates a coolant through coolant lines 30 and 32 to and from an enclosed cooling chamber 34 that is part of the plasma chamber 20. The system also includes a vacuum pump system 36, a gas supply system 38 that delivers gas to the plasma chamber 20, and a control system 40 that oversees the operation of the tool and the interactions of the various parts. The RF power supply system 26 includes a separate RF generation system to drive each segment 22 of the upper electrode.

Figure 3:
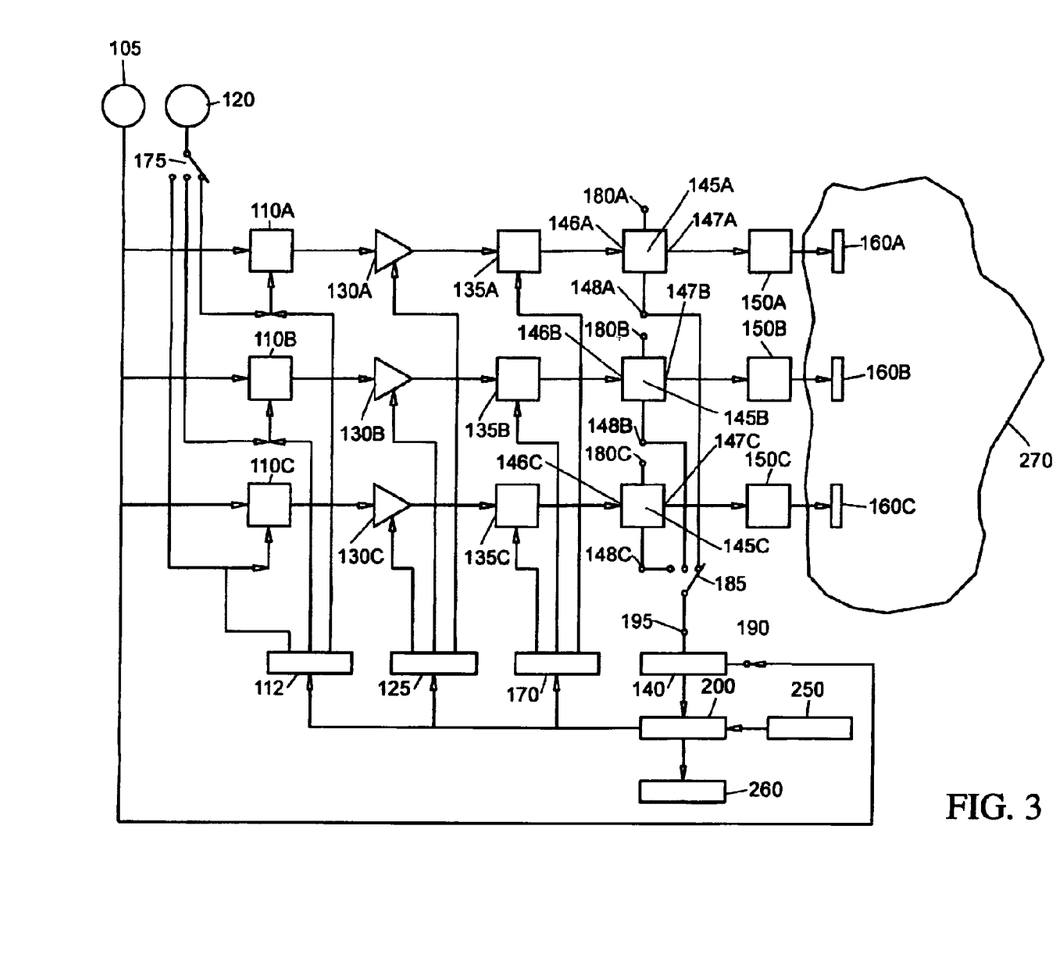
FIG. 3 is a diagram of an embodiment of the present invention depicting a phase modulation circuit with a single modulation source for the electrode segments.

FIG. 3 is a diagram of an embodiment of the present invention depicting a phase modulation circuit with a single modulation source for the electrode segments. The embodiment of FIG. 3 is based on phase modulation with a drive electrode having three segments. In general, the electrode may include any number of segments, N. In the discussion of FIG. 3 that follows, the uppermost electrode segment is referred to as electrode segment A. The circuit associated with electrode segment A, which is denoted by 160A in FIG. 3 (and denoted generally by 22 in FIG. 2), will be described. The circuits associated with the remaining N-1 electrode segments (two additional electrode segments are depicted in FIG. 3) are identical, and corresponding circuit elements are denoted by the same number with an appropriate letter appended after the number (for example, 160A, 160B, and 160C). All of the electrode segments are immersed in plasma 270.

A master RF oscillator 105 from within the RF power supply system 26 (see FIG. 2) provides a common RF signal as the input for the drive circuit for each electrode segment. The power output and frequency of RF oscillator 105 is to be compatible with phase shifters 110, amplifiers 130 and de-modulator 140. The RF oscillator preferably has a frequency of 60 MHz, but other frequencies can alternatively be used. The power output of the amplifiers 130 is preferably on the order of hundreds of watts.

With regard to the drive circuit for electrode segment 160A, the output of RF oscillator 105 is electrically coupled to the input terminal of voltage-controlled phase shifter 110A. The phase difference between the RF voltage at the output terminal of voltage-controlled phase shifter 110A and the RF voltage at the input terminal of voltage-controlled phase shifter 110A is controlled by the sum of the output voltages of phase controller 112 and modulation source 120, both of which are electrically connected to the phase control terminal of phase shifter 110A by means of a summer or adder (not depicted). The phase difference is variable over a range of $2\pi$ radians or, equivalently, 360°.

The frequency and amplitude of modulation voltage source 120 are adjustable, however a frequency in the range from about 1 kHz to 10 kHz is preferred. The amplitude of the output voltage of modulation source 120 determines the amplitude of the AC phase variation produced by phase shifter 110 to which it is electrically connected. The modulation source 120 can be electrically connected to any of the phase shifters 110 by using a selector switch 175 (e.g., a ganged selector switch. FIG. 3 depicts modulation source 120 connected by the selector switch 175 to phase shifter 110A. The selector switch 175 alternatively can be an electronically controlled device, rather than a mechanical device as depicted in FIG. 3. The output terminal of phase shifter 110A is electrically coupled to the input terminal of voltage-controlled RF amplifier 130A. The control terminal of voltage-controlled RF amplifier 130A is electrically coupled to the output terminal of gain controller 125. The output voltage of gain controller 125 controls the gain of the voltage-controlled RF amplifier 130A.

The output of voltage-controlled RF amplifier 130A is electrically coupled to match network 135A, which automatically matches the input impedance presented by the electrode segment 160A at the frequency determined by RF oscillator 105 by a match controller 170, and the output of matching network 135A is electrically connected to the power input port 146A of directional coupler 145A. The power output port 147A of directional coupler 145A is electrically connected to the input terminal of low-pass (or band-pass) filter 150A, which is intended to prevent power generated in the plasma at any harmonics of the RF frequency produced by RF oscillator 105 from reaching match network 135A. Finally, the output terminal of low-pass (or band-pass) filter 150A is electrically connected to electrode segment 160A.

The amount of RF power emerging from electrode segment 160A is directed via terminal 148A of directional coupler 145A to one terminal of a switch 185. In fact, the RF signal emerging from terminal 148A of directional coupler 145A is an attenuated RF voltage comprising a first component associated with the reflection of the RF signal incident on the power coupling structure (i.e. electrode 160A) as well as additional RF components associated with the coupling of RF power between electrodes within the multi-electrode system. The switch 185 can alternatively be an electronically controlled device, rather than a mechanical device as depicted in FIG. 3. Corresponding terminals 148 of directional couplers 145 are electrically connected, respectively, to corresponding terminals of switch 185. By actuating the switch 185, the RF power emerging from any electrode 160 may be connected to the input terminal 195 of synchronous demodulator 140. FIG. 3 depicts electrode segment 160A connected by the switch 185 to the input terminal 195 of synchronous demodulator 140.

The reference terminal 190 of synchronous demodulator 140 is also depicted in FIG. 3 as electrically connected to the output of the master RF oscillator 105. Although the demodulator of this embodiment is a synchronous demodulator 140, a simpler nonsynchronous demodulator may be used instead, albeit with somewhat reduced immunity to noise. In addition, the amount of RF power incident upon electrode segment 160A from match network 135A may be measured at terminal 180A of directional coupler 145A (by a detection system not depicted).

One such demodulator 140 could be an I-Q demodulator, wherein provided a RF input 195 and a local (reference) oscillator input 190, it outputs two signals at the modulation frequency, namely, $I(t)=I \cos(\omega_m t)$ and $Q(t)=Q \sin(\omega_m t)$, where $\omega_m$ is the modulation frequency. The amplitudes I and Q may be used to compute $(I^2+Q^2)^{1/2}$ which is proportional to the desired power to be measured. When, for instance, selector switch 175 is set such that the RF signal incident on electrode 160A is phase-modulated and selector switch 185 is set such that it receives a RF signal from output 148A of directional coupler 145A, then the output (described above) from demodulator 140 is proportional to the RF power associated with the reflections of the corresponding RF power incident at electrode 160A through match network 135A (and measured at node 180A). Furthermore, while keeping the selector switch 175 unchanged, selector switch 185 may be changed to receive the RF signal from output 148B of directional coupler 145B and then the output from demodulator 140 is proportional to the power coupled from electrode 160Aa to electrode 160B. Similarly, this may be carried out through the Nth electrode. Therefore, by carrying out this operation for each electrode, one may obtain $N^2$ outputs which, in addition to monitoring the reflected incident power at each electrode (N signals), one also provides sufficient information (the remaining N(N−1) signals) to understand the coupling between electrodes of a N-electrode system as described in FIG. 1.

Moreover, the output from the demodulator 140 (as described above) can be calibrated (if necessary) by performing the $N^2$ measurements described above while only delivering RF power to a single electrode. For example, phase-modulated RF power is delivered to a first electrode (in the multi-electrode system) while sequentially recording the output from demodulator 140 for each selector switch 185 setting (i.e. each electrode) and, using a second directional coupler and detector (not shown) in line with the first directional coupler 145, sequentially recording the power emerging from the respective electrode 160 in a direction from the electrode 160 to the match network 135. Simply by increasing the power to the given electrode, one may increase the reflected power and power coupled to other electrodes, wherein a calibration curve for the output of demodulator 140 and power can be assembled. This sequence of measurements is then performed for each of the remaining electrodes. Moreover, the calibration may be repeated while delivering power to multiple electrodes to check the significance of nonlinear effects.

Finally, a processor or computer 200 controls, by using appropriate software, a phase controller 112, a gain controller 125, a match controller 170, and, preferably, switches 175 and 185. Input to the computer 200 by an operator is affected by an input device 250, which is, for example, a keyboard or a touch-sensitive screen. The computer 200 includes a computer monitor 260, upon which data obtained by the measurement system is displayed. In one embodiment, the computer 200 may serve to provide the match network controller with the above-mentioned information, particularly the measurement of the reflected incident power at each electrode. In turn, the match network controller may be programmed to minimize the reflected incident power at each electrode and serve the purpose of providing a repeatable plasma process using the multi-electrode system. Similar to controllers in the prior art, this system provides information on the forward and reflected incident power at each electrode in a multi-electrode configuration to the control algorithm of the match network controller.

Figure 4:
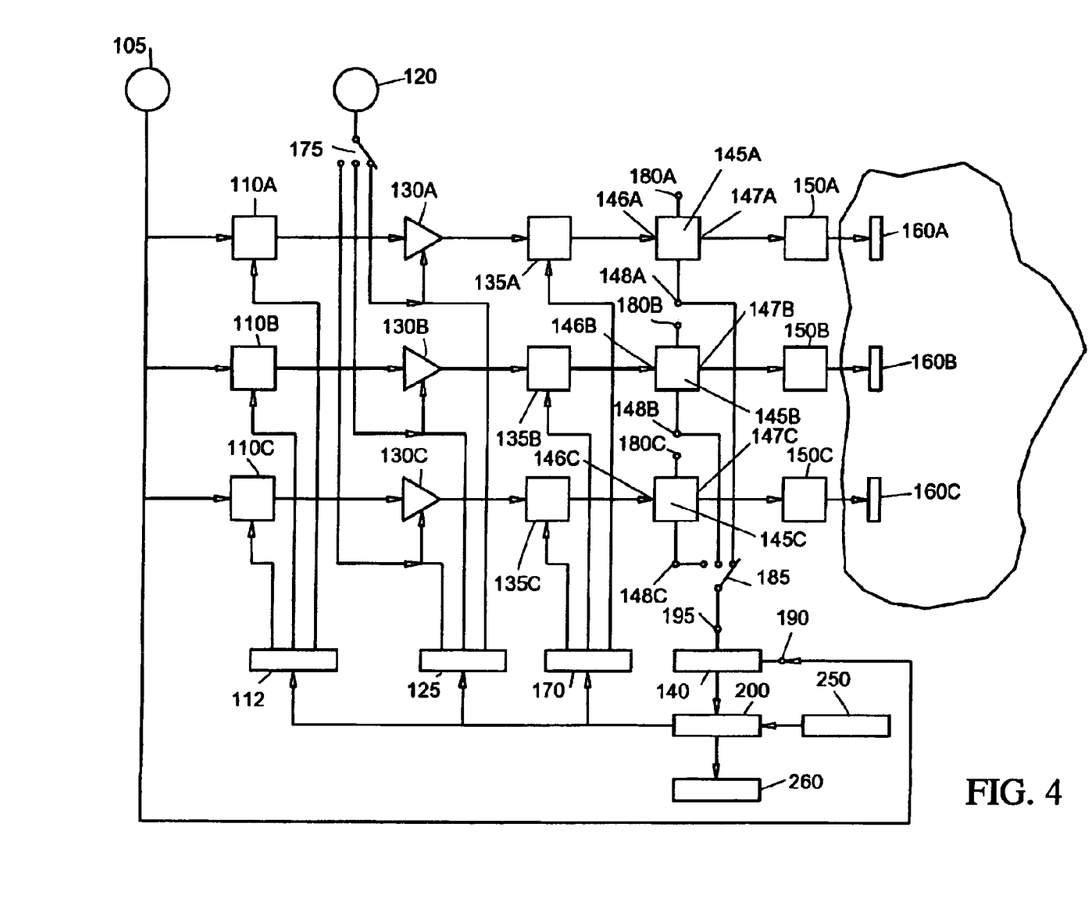
FIG. 4 is a diagram of an alternative embodiment of the present invention depicting an amplitude modulation circuit with a single modulation source for the electrode segments.

FIG. 4 is a diagram of an alternative embodiment of the present invention depicting an amplitude modulation circuit with a single modulation source for the electrode segments. The embodiment depicted in FIG. 4 is based on amplitude modulation with a drive electrode having three segments. In general, the electrode may include N segments. In the discussion of FIG. 4 that follows, the uppermost electrode segment is referred to as electrode segment Aa. The circuit associated with electrode segment A, which is denoted by 160A in FIG. 4 (and denoted generally by 22 in FIG. 2), will be described. The circuits associated with the remaining N−1 electrode segments (two additional electrode segments are depicted in FIG. 4) are identical, and corresponding circuit elements are denoted by the same number with an appropriate letter appended after the number.

A master RF oscillator 105 from within the RF power supply system 26 (see FIG. 2) provides a common RF signal as the input for the drive circuit for each electrode segment. The power output and frequency of RF oscillator 105 is compatible with phase shifters 110, amplifiers 130 and demodulator 140. The RF oscillator 105 has a frequency that is preferably 60 MHz, but other frequencies are possible. The power output of the amplifiers 130 is preferably on the order of hundreds of watts.

With regard to the drive circuit for electrode segment 160A, the output of RF oscillator 105 is electrically coupled to the input terminal of voltage-controlled phase shifter 110A. The phase difference between the RF voltage at the output terminal of voltage-controlled phase shifter 110A and the RF voltage at the input terminal of voltage-controlled phase shifter 110A is controlled by the output voltage of phase controller 112 which is electrically connected to the phase control terminal of phase shifter 110A. The phase difference is variable over a range of $2\pi$ radians or, equivalently, 360°. The output terminal of phase shifter 10A is electrically connected to the input terminal of voltage-controlled RF amplifier 130A.

The modulation source 120 may be electrically connected to any of the voltage-controlled RF amplifiers 130 by a selector switch 175. The frequency and amplitude of modulation voltage source 120 are adjustable, however a frequency in the range from about 1 kHz to 10 kHz is preferred. The amplitude of the output voltage of modulation source 120 determines the amplitude of the AC variation (ripple) of the output voltage produced by amplifier 130A to which it is electrically connected. The instantaneous voltage gain of amplifier 130A is controlled by the sum of the DC output voltage of gain controller 125 and the AC output voltage of modulation source 120, both of which are electrically connected to the gain control terminal of voltage-controlled RF amplifier 130A by a summer or adder (not depicted). FIG. 4 depicts modulation source 120 connected by the selector switch 175 to the control terminal of voltage-controlled RF amplifier 130A. The selector switch 175 can be an electronically controlled device, rather than a mechanical device as depicted in FIG. 4.

The output of voltage-controlled RF amplifier 130A is electrically coupled to a match network 135A, which automatically matches the input impedance at the electrode segment 160A at the frequency determined by RF oscillator 105 using a match controller 170, and the output of matching network 135A is electrically connected to the power input port 146A of directional coupler 145A. The power output port 147A of directional coupler 145A is electrically connected to the input terminal of low-pass (or band-pass) filter 150A, which is intended to prevent power generated in the plasma at any harmonics of the RF frequency produced by RF oscillator 105 from reaching match network 135A. Finally, the output terminal of low-pass (or bandpass) filter 150A is electrically connected to electrode segment 160A.

The amount of RF power emerging from electrode segment 160A is directed via terminal 148A of directional coupler 145A to one terminal of a switch 185. In fact, the RF signal emerging from terminal 148A of directional coupler 145A is an attenuated RF voltage comprising a first component associated with the reflection of the RF signal incident on the power coupling structure (i.e. electrode 160A) as well as additional RF components associated with the coupling of RF power between electrodes within the multi-electrode system. The switch 185 can be an electronically controlled device, rather than a mechanical device as depicted in FIG. 4. Corresponding terminals 148 of directional couplers 145 are electrically connected, respectively, to corresponding terminals of the switch 185. The RF power emerging from any electrode 160 can be connected to the input terminal 195 of synchronous demodulator 140 by using the switch 185. FIG. 4 depicts electrode segment 160A connected by the switch 185 to the input terminal 195 of synchronous demodulator 140.

The reference terminal 190 of synchronous demodulator 140 is also depicted in FIG. 4 as electrically connected to the output of the master RF oscillator 105. Although the demodulator of this embodiment is a synchronous demodulator 140, a simpler nonsynchronous demodulator may be used instead, albeit with somewhat reduced immunity to noise.

In addition, the amount of RF power incident upon electrode segment 160A from match network 135A may be measured at terminal 180A of directional coupler 145A (by using a detection system that is not depicted).

One such demodulator 140 could be an I-Q demodulator, wherein provided a RF input 195 and a local (reference) oscillator input 190, it outputs two signals at the modulation frequency, namely, $I(t)=I\cos(\omega_m t)$ and $Q(t)=Q\sin(\omega_m t)$, where $\omega_m$ is the modulation frequency. The amplitudes I and Q may be used to compute $(I^2+Q^2)^{1/2}$ which is proportional to the desired power to be measured. When, for instance, selector switch 175 is set such that the RF signal incident on electrode 160A is phase-modulated and selector switch 185 is set such that it receives a RF signal from output 148A of directional coupler 145A, then the output (described above) from demodulator 140 is proportional to the RF power associated with the reflections of the corresponding RF power incident at electrode 160A through match network 135A (and measured at node 180A). Furthermore, while keeping the selector switch 175 unchanged, selector switch 185 may be changed to receive the RF signal from output 148B of directional coupler 145B and then the output from demodulator 140 is proportional to the power coupled from electrode 160A to electrode 160B. Similarly, this may be carried out through the Nth electrode. Therefore, by carrying out this operation for each electrode, one may obtain $N^2$ outputs which, in addition to monitoring the reflected incident power at each electrode (N signals), one also provides sufficient information (the remaining N(N−1) signals) to understand the coupling between electrodes of a N-electrode system as described in FIG. 1.

Moreover, the output from the demodulator 140 (as described above) can be calibrated (if necessary) by performing the $N^2$ measurements described above while only delivering RF power to a single electrode. For example, amplitude-modulated RF power is delivered to a first electrode (in the multi-electrode system) while sequentially recording the output from demodulator 140 for each selector switch 185 setting (i.e. each electrode) and, using a second directional coupler and detector (not shown) in line with the first directional coupler 145, sequentially recording the power emerging from the respective electrode 160 in a direction from the electrode 160 to the match network 135. Simply by increasing the power to the given electrode, one may increase the reflected power and power coupled to other electrodes, wherein a calibration curve for the output of demodulator 140 and power can be assembled. This sequence of measurements is then performed for each of the remaining electrodes. Moreover, the calibration may be repeated while delivering power to multiple electrodes to check the significance of nonlinear effects. Finally, a computer or processor 200 controls, using appropriate software, a phase controller 112, a gain controller 125, a match controller 170, and, preferably, switches 175 and 185. Input to the computer 200 by an operator is affected by using an input device 250, which is, for example, a keyboard or a touch-sensitive screen. The computer 200 preferably includes a computer monitor 260, by which data obtained by the measurement system can be displayed. In one embodiment, the computer 200 may serve to provide the match network controller with the above-mentioned information, particularly the measurement of the reflected incident power at each electrode. In turn, the match network controller may be programmed to minimize the reflected incident power at each electrode and serve the purpose of providing a repeatable plasma process using the multi-electrode system. Similar to controllers in the prior art, this system provides information on the forward and reflected incident power at each electrode in a multi-electrode configuration to the control algorithm of the match network controller.

Figure 5A:
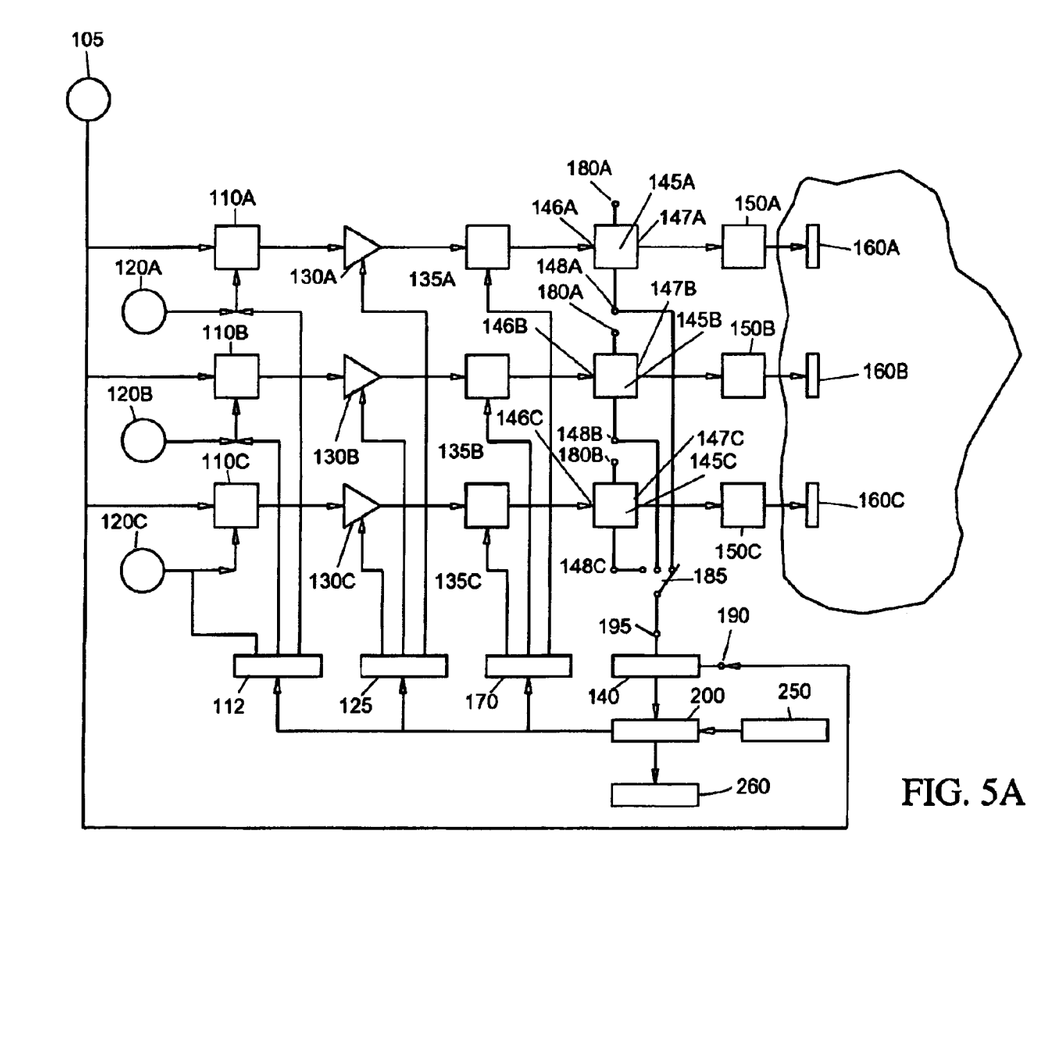
FIG. 5A is a diagram of an embodiment of the present invention depicting a phase modulation circuit with independent modulation sources for each electrode segment.

FIG. 5A is a diagram of an embodiment of the present invention depicting a phase modulation circuit with independent modulation sources for each electrode segment. The embodiment depicted in FIG. 5A is based on phase modulation with a drive electrode having 3 segments. In general, the electrode may include N segments. In the discussion of FIG. 5A that follows, the uppermost electrode segment is referred to as electrode segment A. The circuit associated with electrode segment A, which is denoted by 160A in FIG. 5A (and denoted generally by 22 in FIG. 2), will be described. The circuits associated with the remaining N−1 electrode segments (two additional electrode segments are shown in FIG. 5A) are identical, and corresponding circuit elements are denoted by the same number with an appropriate letter appended after the number. All of the electrode segments are immersed in plasma 270.

A master RF oscillator 105 from within the RF power supply system 26 (see FIG. 2) provides a common RF signal as the input for the drive circuit for each electrode segment. The power output and frequency of RF oscillator 105 is to be compatible with phase shifters 110, amplifiers 130, and demodulator 140. The oscillator has a frequency that is preferably 60 MHz, but other frequencies are possible. The power output of the amplifiers 130 is typically of the order of hundreds of watts.

With regard to the drive circuit for electrode segment 160A, the output of RF oscillator 105 is electrically coupled to the input terminal of voltage-controlled phase shifter 110A. The phase difference between the RF voltage at the output terminal of voltage-controlled phase shifter 110A and the RF voltage at the input terminal of voltage-controlled phase shifter 110A is controlled by the sum of the output voltages of phase controller 112 and modulation source 120A, both of which are electrically connected to the phase control terminal of phase shifter 110A by a summer or adder (not depicted). The phase difference is variable over a range of $2\pi$ radians or, equivalently, 360°.

The frequency and amplitude of modulation voltage source 120A are adjustable, and a frequency in the range from about 1 kHz to 10 kHz is preferred. In this embodiment, the frequencies of modulation sources 120A, 120B, and 120C must be unique and the frequency ratios should preferably not be rational numbers. The amplitude of the output voltage of modulation source 120A determines the amplitude of the AC phase variation produced by phase shifter 110A to which it is electrically connected. The output terminal of phase shifter 110A is electrically coupled to the input terminal of voltage-controlled RF amplifier 130A. The control terminal of voltage-controlled RF amplifier 130A is electrically coupled to the output terminal of gain controller 125. The output voltage of gain controller 125 controls the gain of the voltage-controlled RF amplifier 130A.

The output of voltage-controlled RF amplifier 130A is electrically coupled to match network 135A, which automatically matches the input impedance presented by the electrode segment 160A at the frequency determined by RF oscillator 105 by using a match controller 170, and the output of matching network 135A is electrically connected to the power input port 146A of directional coupler 145A. The power output port 147A of directional coupler 145A is electrically connected to the input terminal of low-pass (or band-pass) filter 150A, which is intended to prevent power generated in the plasma at any harmonics of the RF frequency produced by RF oscillator 105 from reaching match network 135A. Finally, the output terminal of low-pass (or band-pass) filter 150A is electrically connected to electrode segment 160A.

The amount of RF power emerging from electrode segment 160A is directed via terminal 148A of directional coupler 145A to one terminal of a switch 185. In fact, the RF signal emerging from terminal 148A of directional coupler 145A is an attenuated RF voltage comprising a first component associated with the reflection of the RF signal incident on the power coupling structure (i.e. electrode 160A) as well as additional RF components associated with the coupling of RF power between electrodes within the multi-electrode system. The switch 185 can be an electronically controlled device, rather than a mechanical device as depicted in FIG. 5A. The respective terminals 148 of directional couplers 145 are electrically connected to respective terminals of the switch 185. The RF power emerging from any electrode 160 can be connected to the input terminal 195 of synchronous demodulator 140 by using the switch 185. FIG. 5A depicts electrode segment 160A connected by the switch 185 to the input terminal 195 of synchronous demodulator 140.

The reference terminal 190 of synchronous demodulator 140 is also depicted in FIG. 5A as electrically connected to the output of the master RF oscillator 105. The preferred demodulator for this embodiment is a synchronous demodulator 140, but a simpler non-synchronous demodulator can be used instead, albeit with somewhat reduced sensitivity and immunity to noise.

In addition, the amount of RF power incident upon electrode segment 160A from match network 135A can be measured at terminal 180A of directional coupler 145A (by a detection system not depicted).

Figure 5B:
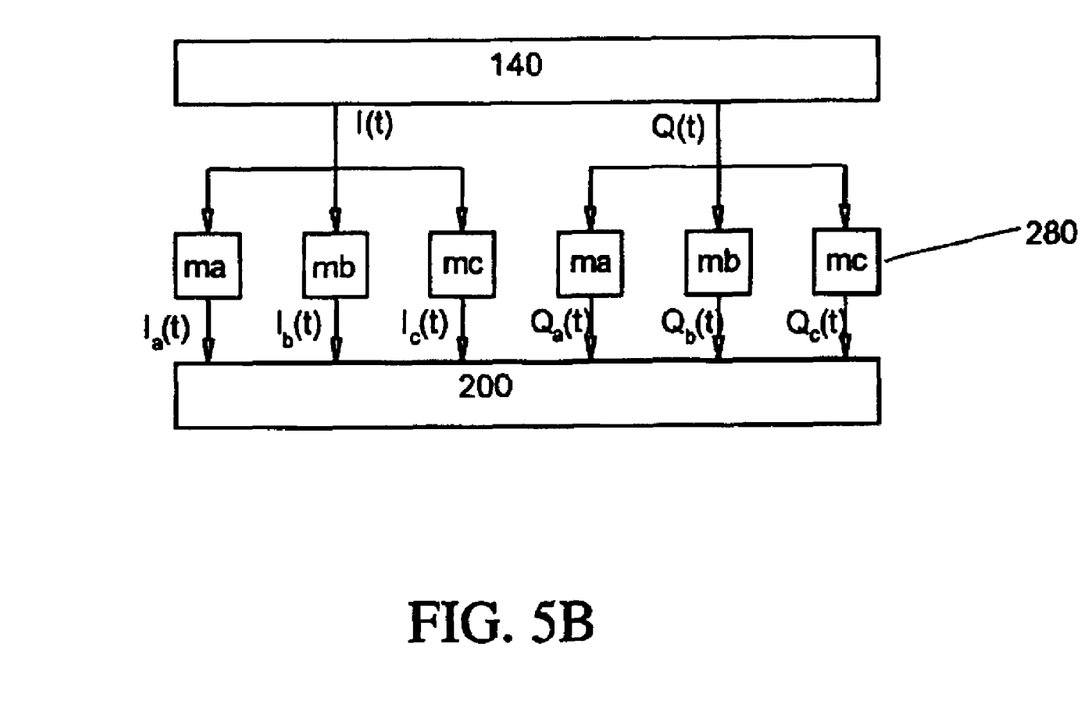
FIG. 5B is a diagram describing an array of filters to be used with the embodiments presented in FIGS. 5A and 6.

One such demodulator 140 could be an I-Q demodulator, wherein provided a RF input 195 and a local (reference) oscillator input 190, it outputs two signals at the modulation frequencies, namely, $I(t)=I_a \cos(\omega_{ma}t)+I_b \cos(\omega_{mb}t)+I_c \cos(\omega_{mc}t)$ and $Q(t)=Q_a \sin(\omega_{ma}t)+Q_b\sin(\omega_{mb}t)+Q_c\sin(\omega_{mc}t)$, where $\omega_{ma}$, $\omega_{mb}$ and $\omega_{mc}$ are the modulation frequencies for each electrode 160A, 160B and 160C from modulation sources 120A, 120B and 120C, and $I_a$, $I_b$, $I_c$, $Q_a$, $Q_b$ and $Q_c$ are the corresponding amplitudes of the respective modulation frequencies in the I and Q signals. The signals output from demodulator 140, I(t) and Q(t), may then be filtered digitally within the computer processor 200 via Fourier analysis to extract a signal at each modulation frequency, or the I(t) and Q(t) signals may be filtered externally using an array of band-pass filters 280 prior to A/D conversion at the computer processor 200 as shown in FIG. 5B. The amplitudes $I_j$ and $Q_j$ for the jth modulation frequency $\omega_{mj}$ may be used to compute $(I_j^2+Q_j^2)^{1/2}$ which is proportional to the desired power to be measured. When, for instance, selector switch 185 is set such that it receives a RF signal from output 148A of directional coupler 145A, then the amplitude $(I_a^2+Q_a^2)^{1/2}$ of filtered output at modulation frequency $\omega_{ma}$ (described above) from demodulator 140 is proportional to the RF power associated with the reflections of the corresponding RF power incident at electrode 160A through match network 135A (and measured at node 180A), the amplitude $(I_b^2+Q_b^2)^{1/2}$ of filtered output at modulation frequency $\omega_{mb}$ from demodulator 140 is proportional to power from electrode 160B coupled to electrode 160A, and the amplitude $(I_c^2+Q_c^2)^{1/2}$ of filtered output at modulation frequency $\omega_{mc}$ from demodulator 140 is proportional to power from electrode 160C coupled to electrode 160A. Similarly, this may be carried out through the Nth electrode by changing the setting for selector switch 185. Therefore, by carrying out this operation for each electrode, one may obtain $N^2$ outputs which, in addition to monitoring the reflected incident power at each electrode (N signals), one also provides sufficient information (the remaining N(N−1) signals) to understand the coupling between electrodes of a N-electrode system as described in FIG. 1.

Moreover, the output from the demodulator 140 (as described above) can be calibrated (if necessary) by performing the $N^2$ measurements described above while only delivering RF power to a single electrode. For example, phase-modulated RF power is delivered to a first electrode (in the multi-electrode system) while sequentially recording the output from demodulator 140 for each selector switch 185 setting (i.e. each electrode) and, using a second directional coupler and detector (not shown) in line with the first directional coupler 145, sequentially recording the power emerging from the respective electrode 160 in a direction from the electrode 160 to the match network 135. Simply by increasing the power to the given electrode, one may increase the reflected power and power coupled to other electrodes, wherein a calibration curve for the output of demodulator 140 and power can be assembled. This sequence of measurements is then performed for each of the remaining electrodes. Moreover, the calibration may be repeated while delivering power to multiple electrodes to check the significance of nonlinear effects.

Finally, a computer or processor 200 controls, by using appropriate software, a phase controller 112, a gain controller 125, a match controller 170, and, perhaps, switches 175 and 185. Input to the computer 200 by an operator is affected by using an input device 250, which is, for example, a keyboard or a touch-sensitive screen. The computer 200 includes a computer monitor 260, by which data obtained by the measurement system is displayed. In one embodiment, the computer 200 may serve to provide the match network controller with the above-mentioned information, particularly the measurement of the reflected incident power at each electrode. In turn, the match network controller may be programmed to minimize the reflected incident power at each electrode and serve the purpose of providing a repeatable plasma process using the multi-electrode system. Similar to controllers in the prior art, this system provides information on the forward and reflected incident power at each electrode in a multi-electrode configuration to the control algorithm of the match network controller.

Figure 6:
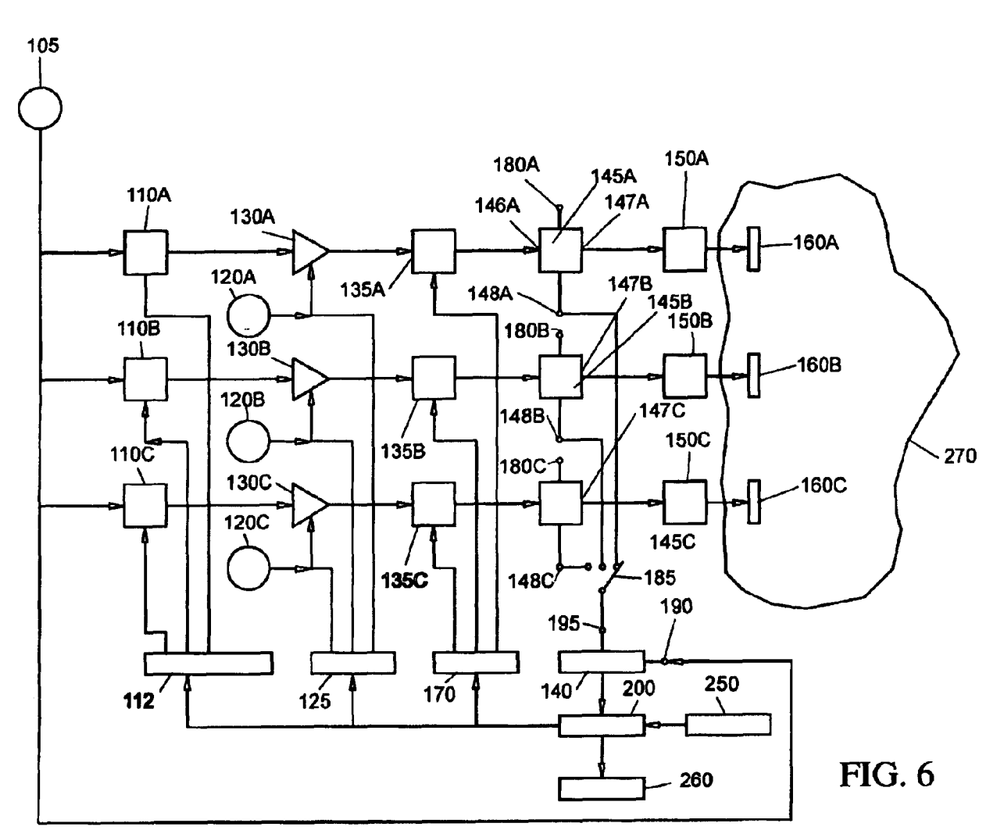
FIG. 6 is a diagram of an alternative embodiment of the present invention depicting an amplitude modulation circuit with independent modulation sources for each electrode segment.

FIG. 6 is a diagram of an alternative embodiment of the present invention depicting an amplitude modulation circuit with independent modulation sources for each electrode segment. The embodiment of the present invention depicted in FIG. 6 is based on amplitude modulation with a drive electrode having three segments. In general, the electrode includes N segments. In the discussion of FIG. 6 that follows, the uppermost electrode segment is referred to as electrode segment A. The circuit associated with electrode segment A, which is denoted by 160A in FIG. 6 (and denoted generally by 22 in FIG. 2), will be described. The circuits associated with the remaining N−1 electrode segments (two additional electrode segments are depicted in FIG. 6) are identical, and corresponding circuit elements are denoted by the same number with an appropriate letter appended after the number. All of the electrode segments are immersed in plasma 270.

A master RF oscillator 105 from within the RF power supply system 26 (see FIG. 2) provides a common RF signal as the input for the drive circuit for each electrode segment. The power output and frequency of RF oscillator 105 is compatible with phase shifters 110, amplifiers 130, and demodulator 140. The oscillator 105 has a frequency that is preferably 60 MHz, but other frequencies are possible. The power output of the amplifiers 130 is preferably on the order of hundreds of watts.

With regard to the drive circuit for electrode segment 160A, the output of RF oscillator 105 is electrically coupled to the input terminal of voltage-controlled phase shifter 110A. The phase difference between the RF voltage at the output terminal of voltage-controlled phase shifter 110A and the RF voltage at the input terminal of voltage-controlled phase shifter 110A is controlled by the output voltage of phase controller 112 which is electrically connected to the phase control terminal of phase shifter 110A. The phase difference is variable over a range of $2\pi$ radians or, equivalently, 360°. The output terminal of phase shifter 110A is electrically connected to the input terminal of voltage-controlled RF amplifier 130A.

In this embodiment, the frequencies of modulation sources 120A, 120B, and 120C must be unique and the frequency ratios should preferably not be rational numbers. The amplitude of the output voltage of modulation source 120 determines the amplitude of the AC variation (ripple) of the output voltage produced by amplifier 130A to which it is electrically connected. The instantaneous voltage gain of amplifier 130A is controlled by the sum of the DC output voltage of gain controller 125 and the AC output voltage of modulation source 120A, both of which can be electrically connected to the gain control terminal of voltage-controlled RF amplifier 130A by a summer or adder (not depicted).

The output of voltage-controlled RF amplifier 130A is electrically coupled to a match network 135A, which automatically matches the input impedance at the electrode segment 160A at the frequency determined by RF oscillator 105 by using a match controller 170, and the output of matching network 135A is electrically connected to the power input port 146A of directional coupler 145A. The power output port 147A of directional coupler 145A is electrically connected to the input terminal of low-pass (or band-pass) filter 150A, which is intended to prevent power generated in the plasma at any harmonics of the RF frequency produced by RF oscillator 105 from reaching match network 135A. Finally, the output terminal of low-pass (or bandpass) filter 150A is electrically connected to electrode segment 160A.

The amount of RF power emerging from electrode segment 160A is directed via a terminal 148A of directional coupler 145A to one terminal of a switch 185. In fact, the RF signal emerging from terminal 148A of directional coupler 145A is an attenuated RF voltage comprising a first component associated with the reflection of the RF signal incident on the power coupling structure (i.e. electrode 160A) as well as additional RF components associated with the coupling of RF power between electrodes within the multi-electrode system. The switch 185 can be an electronically controlled device, rather than a mechanical device as depicted in FIG. 6. Corresponding terminals 148 of directional couplers 145 are electrically connected, respectively, to corresponding terminals of the switch 185. The RF power emerging from any electrode 160 can be connected to the input terminal 195 of synchronous demodulator 140 by using the switch 185. FIG. 6 depicts electrode segment 160A connected by the switch 185 to the input terminal 195 of synchronous demodulator 140.

The reference terminal 190 of synchronous demodulator 140 is also depicted in FIG. 6 as electrically connected to the output of the master RF oscillator 105. Although the demodulator of this embodiment is a synchronous demodulator 140, a simpler non-synchronous demodulator can be used instead, albeit with somewhat reduced immunity to noise.

In addition, the amount of RF power incident upon electrode segment 160A from the match network 135A may be measured at terminal 180A of directional coupler 145A (by a detection system not depicted).

One such demodulator 140 could be an I-Q demodulator, wherein provided a RF input 195 and a local (reference) oscillator input 190, it outputs two signals at the modulation frequencies, namely, $I(t) = I_a \cos(\omega_{ma}t) + I_b \cos(\omega_{mb}t) + I_c \cos(\omega_{mc}t)$ and $Q(t) Q_a \sin(\omega_{ma}t) + Q_b \sin(\omega_{mb}t) + Q_c \sin(\omega_{mc}t)$, where $\omega_{ma}$, $\omega_{mb}$ and $\omega_{mc}$ are the modulation frequencies for each electrode 160A, 160B and 160C from modulation sources 120A, 120B and 120C, and $I_a$, $I_b$, $I_c$, $Q_a$, $Q_b$ and $Q_c$ are the corresponding amplitudes of the respective modulation frequencies in the I and Q signals. The signals output from demodulator 140, I(t) and Q(t), may then be filtered digitally within the computer processor 200 via Fourier analysis to extract a signal at each modulation frequency, or the I(t) and Q(t) signals may be filtered externally using an array of band-pass filters 280 prior to A/D conversion at the computer processor 200 as shown in FIG. 5B. The amplitudes $I_j$ and $Q_j$ for the jth modulation frequency $\omega_{mj}$ may be used to compute $(I_j^2 + Q_j^2)^{1/2}$ which is proportional to the desired power to be measured. When, for instance, selector switch 185 is set such that it receives a RF signal from output 148A of directional coupler 145A, then the amplitude $(I_a^2 + Q_a^2)^{1/2}$ of filtered output at modulation frequency coma (described above) from demodulator 140 is proportional to the RF power associated with the reflections of the corresponding RF power incident at electrode 160A through match network 135A (and measured at node 180A), the amplitude $(I_b^2 + Q_b^2)^{1/2}$ of filtered output at modulation frequency $\omega_{mb}$ from demodulator 140 is proportional to power from electrode 160B coupled to electrode 160A, and the amplitude $(I_c^2 + Q_c^2)^{1/2}$ of filtered output at modulation frequency $\omega_{mc}$ from demodulator 140 is proportional to power from electrode 160C coupled to electrode 160A. Similarly, this may be carried out through the Nth electrode by changing the setting for selector switch 185. Therefore, by carrying out this operation for each electrode, one may obtain $N^2$ outputs which, in addition to monitoring the reflected incident power at each electrode (N signals), one also provides sufficient information (the remaining N(N−1) signals) to understand the coupling between electrodes of a N-electrode system as described in FIG. 1.

Moreover, the output from the demodulator 140 (as described above) can be calibrated (if necessary) by performing the $N^2$ measurements described above while only delivering RF power to a single electrode. For example, amplitude-modulated RF power is delivered to a first electrode (in the multi-electrode system) while sequentially recording the output from demodulator 140 for each selector switch 185 setting (i.e. each electrode) and, using a second directional coupler and detector (not shown) in line with the first directional coupler 145, sequentially recording the power emerging from the respective electrode 160 in a direction from the electrode 160 to the match network 135. Simply by increasing the power to the given electrode, one may increase the reflected power and power coupled to other electrodes, wherein a calibration curve for the output of demodulator 140 and power can be assembled. This sequence of measurements is then performed for each of the remaining electrodes. Moreover, the calibration may be repeated while delivering power to multiple electrodes to check the significance of nonlinear effects.

Finally, a computer or processor 200 controls, by using appropriate software, a phase controller 112, a gain controller 125, a match controller 170, and, perhaps, switches 175 and 185. Input to the computer 200 by an operator is affected by an input device 250, which is, for example, a keyboard or a touch-sensitive screen. The computer 200 includes a computer monitor 260, by which data obtained by the measurement system is displayed. In one embodiment, the computer 200 may serve to provide the match network controller with the above-mentioned information, particularly the measurement of the reflected incident power at each electrode. In turn, the match network controller may be programmed to minimize the reflected incident power at each electrode and serve the purpose of providing a repeatable plasma process using the multi-electrode system. Similar to controllers in the prior art, this system provides information on the forward and reflected incident power at each electrode in a multi-electrode configuration to the control algorithm of the match network controller.

All of the embodiments described in FIGS. 3 through 6 may further include an isolator (or circulator with a load) connected to the output of amplifier 130 and input of match network 135. The isolator can protect the amplifier 130 from reflected RF power and RF power coupled from other electrodes.

With regard to the embodiments depicted in FIGS. 3–6, the match network components of a given circuit arm (e.g., 135A) can be adjusted via input to the match network controller 170 from the computer 200 (and from the demodulator 140) to reduce the reflected power at electrode 160A associated with a reflection of the power incident on the electrode 160A from a signal generated by oscillator 105 and amplified by amplifier 130A. In other words, the apparatus and methods described in the above disclosed embodiments are capable of dissecting the RF power measured at coupler 180 and dissociating the reflected "incident" signal from those signals associated with coupling from the other electrodes. In this manner, a repeatable impedance match can be obtained for each electrode in a multi-electrode system, which can, in turn, contribute to repeatable process results.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

What is claimed is:

1. An apparatus for improved impedance matching between an RF signal and a multi-segmented electrode in a plasma reactor powered by the RF signal, said apparatus comprising an electrode segment adapted to be connected to the RF signal by a circuit comprising:

a phase shifter adapted to be connected to the RF signal;

an amplifier connected to an output of said phase shifter;

a matching network connected to an output of said amplifier, said matching network being configured to match an impedance of the amplifier with an impedance of said electrode segment;

a modulation source configured to modulate the RF signal prior to receipt by said matching network;

a directional coupler connected to an output of said matching network, said directional coupler having an output connected to said electrode segment;

a demodulator being configured to receive an output signal from said directional coupler and a reference signal; and a control system connected to an output of said demodulator, said control system being configured to control said matching network such that said output signal of said directional coupler and said reference signal produce a signal of substantially minimized amplitude.

2. The apparatus according to claim 1, wherein said modulation source is connected to an input terminal of said phase shifter.

3. The apparatus according to claim 1, wherein said modulation source is connected to an input terminal of said amplifier.

4. The apparatus according to claim 1, wherein said modulation source is adjustable.

5. The apparatus according to claim 1, wherein said reference signal is received by said demodulator from said master RF oscillator.

6. The apparatus according to claim 1, wherein said demodulator is synchronous.

7. The apparatus according to claim 1, wherein said demodulator is non-synchronous.

8. The apparatus according to claim 1, wherein said control system is configured to control said phase shifter and said amplifier.

9. The apparatus according to claim 1, further comprising a filter connected to an output of said directional coupler, said filter having an output connected to said electrode segment.

10. The apparatus according to claim 1, further comprising an additional electrode segment adapted to be connected to the RF signal by said circuit, said circuit further comprising:

an additional phase shifter adapted to be connected to the RF signal;

an additional amplifier connected to an output of said additional phase shifter;

an additional matching network connected to an output of said additional amplifier, said additional matching network being configured to match an impedance of the additional amplifier with an impedance of said additional electrode segment;

said modulation source being selectively configured to modulate the RF signal prior to receipt by said additional matching network;

an additional directional coupler connected to an output of said additional matching network, said additional directional coupler having an output connected to said additional electrode segment;

said demodulator being configured to selectively receive an output signal from said additional directional coupler and an additional reference signal representing the RF signal at the output of said master RF oscillator; and said control system being configured to control said output of said additional matching network such that said output signal of said additional directional coupler and said additional reference signal sent via said demodulator produce a signal of substantially minimized amplitude.

11. The apparatus according to claim 1, further comprising an additional electrode segment adapted to be connected to the RF signal by said circuit, said circuit further comprising:

an additional phase shifter adapted to be connected to the RF signal;

an additional amplifier connected to an output of said additional phase shifter;

an additional matching network connected to an output of said additional amplifier, said additional matching network being configured to match an impedance of the RF signal with an impedance of said additional electrode segment;

an additional modulation source configured to modulate the RF signal prior to receipt by said additional matching network;

an additional directional coupler connected to an output of said additional matching network, said additional directional coupler having an output connected to said additional electrode segment;

said demodulator being configured to receive an output signal from said additional directional coupler and an additional reference signal representing a RF signal at the output of said master RF oscillator; and said control system connected to said output of said demodulator, said control system being configured to control said output of said additional matching network such that said output signal of said additional directional coupler and said additional reference signal sent via said demodulator produce a signal of substantially minimized amplitude.

12. An apparatus for improved impedance matching between an RF signal and a multi-segmented electrode in a plasma reactor powered by the RF signal, said apparatus comprising an electrode segment adapted to be connected to the RF signal by a circuit comprising:

a phase shifter adapted to be connected to the RF signal;

an amplifier connected to an output of said phase shifter;

a matching network connected to an output of said amplifier, said matching network being configured to match an impedance of the amplifier with an impedance of said electrode segment;

a modulation source configured to modulate the RF signal prior to receipt by said matching network;

a directional coupler connected to an output of said matching network, said directional coupler having an output connected to said electrode segment; and means for adjusting said output of said match network such that an output signal from said directional coupler and a reference signal from a RF signal at the output of said master RF oscillator produce a signal of substantially minimized amplitude.

13. A plasma reactor comprising:

a process chamber;

a multi-segmented electrode within said process chamber;

a RF power supply system configured to generate a RF signal to drive an electrode segment of said multi-segmented electrode; and a circuit connecting said electrode segment to said RF signal, and circuit comprising:

a phase shifter adapted to be connected to said RF signal, a matching network connect to an output of said amplifier, said matching network being configured to match an impedance of said amplifier with an impedance of said electrode segment, a modulation source configured to modulate said RF signal prior to receipt by said matching network, a directional coupoler connected to an output of said matching network, said directional coupler having an output connected to said electrode segment, a demodulator being configured to receive an output signal frm said directional coupler and a reference signal representing a RF signal at the output of said master RF oscillator, and a control system connected to an output of said demodulator, said control system being configured to control said output of said matching network such that said output signal of said directional coupler and said reference signal sent via said demodulator produce a signal substantially minimized amplitude.

14. An apparatus for improved impedance matching between an RF signal and a multi-electrode plasma reactor powered by the RF signal, said apparatus comprising at least one electrode adapted to be connected to the RF signal by a circuit comprising:

a phase shifter adapted to be connected to the RF signal;

am amplifier connected to an output of said phase shifter;

a matching network connected to an output of said amplifier, said matching network being configured to match an impedance of the amplifier with an impedance of said electrode;

a modulation source configured to modulate the RF signal prior or to receipt by said matching network;

directional coupler connected to an output of said matching network, said directional coupler having an output connected to said electrode;

demodulator being configured to receive an output signal from said directional coupler and a reference signal representing a RF signal at the output of the master RF oscillator; and control system connected to an output of said demodulator, said control system being configured to control said output of said matching network such that said output signal of said directional coupler and said reference signal sent via said demodulator produce a signal of substantially minimized amplitude.

15. A method according to claim 14, wherein said electrode comprises at least one of a plate electrode, an electrode segment, and an inductive cell.

* * * * *